(12) United States Patent
Johnson

(10) Patent No.: US 11,124,073 B2
(45) Date of Patent: Sep. 21, 2021

(54) MULTI-ELECTRIC SOURCE VEHICLE

(71) Applicant: Hyster-Yale Group, Inc., Fairview, OR (US)

(72) Inventor: Benjamin Johnson, Fairview, OR (US)

(73) Assignee: HYSTER-YALE GROUP, INC., Fairview, OR (US)

( * ) Notice: Subject to any disclaimer, the term of this patent is extended or adjusted under 35 U.S.C. 154(b) by 118 days.

(21) Appl. No.: 16/171,066

(22) Filed: Oct. 25, 2018

(65) Prior Publication Data

US 2019/0135112 A1    May 9, 2019

Related U.S. Application Data

(60) Provisional application No. 62/581,518, filed on Nov. 3, 2017.

(51) Int. Cl.
| | |
|---|---|
| *B60L 3/00* | (2019.01) |
| *B60L 15/20* | (2006.01) |
| *G01R 31/378* | (2019.01) |
| *B60L 3/12* | (2006.01) |
| *B60L 58/18* | (2019.01) |
| *G01R 31/367* | (2019.01) |
| *B60L 58/12* | (2019.01) |

(52) U.S. Cl.
CPC ............... *B60L 3/0046* (2013.01); *B60L 3/12* (2013.01); *B60L 15/20* (2013.01); *B60L 58/18* (2019.02); *G01R 31/367* (2019.01); *G01R 31/378* (2019.01); *B60L 58/12* (2019.02); *B60L 2200/42* (2013.01); *B60L 2240/54* (2013.01); *B60L 2250/16* (2013.01); *B60L 2270/40* (2013.01)

(58) Field of Classification Search
CPC ...... B60L 3/0046; B60L 2240/54; B60L 3/12; B60L 2250/16; B60L 58/12; B60L 15/20; G01R 31/367
See application file for complete search history.

(56) References Cited

U.S. PATENT DOCUMENTS

| | | | |
|---|---|---|---|
| 2013/0031318 A1* | 1/2013 | Chen | B60L 7/14 |
| | | | 711/154 |
| 2014/0277887 A1* | 9/2014 | Slattery | B60L 3/0046 |
| | | | 701/22 |
| 2017/0297880 A1 | 10/2017 | Kirk et al. | |

FOREIGN PATENT DOCUMENTS

| | | |
|---|---|---|
| CN | 205634769 U | 10/2016 |
| EP | 3231655 A1 | 10/2017 |
| JP | 2013118753 A | 6/2013 |

OTHER PUBLICATIONS

Strang, T., and M. Roeckl. "Vehicle networks: CAN-based higher layer protocols." (2008), pp. 23, 33 (Year: 2008).*

* cited by examiner

*Primary Examiner* — Alan D Hutchinson
*Assistant Examiner* — Andy Schneider
(74) *Attorney, Agent, or Firm* — Schwabe Williamson & Wyatt

(57) ABSTRACT

Apparatuses, systems, kits, methods and storage medium associated with using different electrical energy source types with an electric vehicle are disclosed herein.

18 Claims, 7 Drawing Sheets

MULTI-ELECTRIC SOURCE VEHICLE

RELATED APPLICATIONS

The present application claims priority to U.S. Provisional Patent Application No. 62/581,518, filed Nov. 3, 2017, entitled "MULTI-ELECTRIC SOURCE VEHICLE", the entire disclosure of which is hereby incorporated by reference.

TECHNICAL FIELD

Using different electrical energy source types with an electric vehicle.

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

Electric vehicles require an electrical energy source for motive power. Commonly available legacy electric vehicles are designed and built to operate using a specific type of electrical energy source. For example, commonly used electrical energy source types for electric vehicles include a lead-acid battery, a nickel-cadmium battery, a nickel-metal hydride battery, a lithium-ion battery, a lithium-ion polymer battery, a zinc-air battery, a molten-salt battery, a hydrogen fuel cell, and an ultra-capacitor. Most commonly, legacy electric vehicles are designed to use a lead-acid battery as the type of electric energy source.

Some owners and operators of electric vehicles desire to use a type of electrical energy source that is different from a type of electric energy source that a particular electric vehicle was designed to use.

The present inventors have recognized that replacing the electrical energy source of a particular electric vehicle with a different type of electrical energy source from that which the electric vehicle was designed to utilize may result in a loss of one or more vehicle functions. For example, replacing a lead-acid battery with a lithium-ion battery in a legacy electric vehicle may cause the electric vehicle's battery status indicator and other functions related to the state-of-charge of the battery to function improperly. For example, such loss of functions may include a battery state-of-charge indicator that is not accurate and may not timely alert an operator of a low charge condition, a vehicle speed limiting function that does not limit the vehicle speed when a pre-determined state-of-charge is reached, a vehicle system lock-out function that does not lock-out a vehicle system when a pre-determined state-of-charge is reached, or other suitable vehicle function that uses battery state-of-charge as an input for the vehicle function. The present inventors have recognized that such loss of functions may result because an electric vehicle designed to operate with a lead-acid battery typically monitors the discharge voltage of the battery to indicate the state-of-charge of the battery, and a lead-acid battery has a different discharge voltage profile compared to a lithium-ion battery. Therefore, the voltage monitoring capability of an electric vehicle designed to operate with a lead-acid battery may not adequately indicate the state-of-charge of a lithium-ion battery.

The present inventors have also recognized that owners and operators of legacy electric vehicles designed to operate with one type of electrical energy source who desire to use a different type of electrical energy source with such vehicles commonly modify such electric vehicles to include additional components, separate from the electronics of the electric vehicles, related to the battery state-of-charge. For example, when using a lithium-ion battery with a legacy electric vehicle designed to operate with a lead-acid battery, owners and operators may include a separate wire harness and display that communicate with a battery management system associated with the lithium-ion battery so that an operator may accurately be informed of the lithium-ion battery's state-of-charge. Such information lets the operator know when the lithium-ion battery is low and needs to be recharged. However, because such additional components do not communicate with the legacy electric vehicle's vehicle system manager ("VSM") (or other suitable vehicle controller), other vehicle functions that use the battery state-of-charge as an input typically do not operate properly because they are receiving battery state-of-charge information from the VSM's discharge voltage monitoring capability, which would typically detect improper charge levels of the lithium-ion battery due to the discharge voltage monitoring capability being designed to work with a lead-acid battery.

Likewise, if an owner or operator of a legacy electric vehicle originally designed to operate with a lithium-ion battery desires to use a lead-acid battery with the vehicle, vehicle functions that use the battery state-of-charge as an input may not operate properly due to improper state-of-charge determination for the lead-acid battery caused by the legacy electric vehicle being configured to determine the state-of-charge for the lithium-ion battery. The present inventors have recognized that improper operation of such vehicle functions that use a lithium-ion battery state-of-charge as an input may result from the VSM requiring battery information from a battery management system that is typically associated with a lithium-ion battery, but is typically not used with a lead-acid battery. Additionally, a legacy electric vehicle designed to operate with a lithium-ion battery typically does not include a discharge voltage monitoring capability that monitors the discharge voltage of the battery.

SUMMARY

An example electric vehicle comprises a vehicle controller operatively connected to a vehicle communication system. There is an electrical energy source and a power relay system connected to the electrical energy source via a power connector and to at least a traction motor for propelling the vehicle. A vehicle mounted electrical energy source status determining unit may communicate with the vehicle controller, and an electrical energy source type indicator may communicate with the vehicle controller. The electrical energy source type indicator may determine a specific type of electrical energy source connected to the vehicle and transmit a type signal to the vehicle controller, where the type signal indicates to the vehicle controller the specific type of the electrical energy source. The vehicle controller may implement programming that causes the vehicle controller to determine whether to use information from the vehicle mounted electrical energy source status determining unit (EESSDU) based on the type signal.

Another example electric vehicle comprises a vehicle controller operatively connected to a vehicle communication system. There is an electrical energy source and a power relay system connected to the electrical energy source via a power connector and to at least a traction motor for propelling the vehicle. A vehicle mounted electrical energy source status determining unit may communicate with the vehicle controller, and an electrical energy source type indicator may communicate with the vehicle controller. The electrical energy source type indicator may determine a specific type of the electrical energy source connected to the vehicle and transmit a type signal to the vehicle controller, where the type signal indicates to the vehicle controller the specific type of the electrical energy source. The vehicle controller may implement programming that causes the vehicle controller to determine whether to use information from the vehicle mounted EESSDU based on the type signal. An electrical energy source communication system may be coupled with the vehicle controller, and the electrical energy source communication system comprises a communication connector configured to interface with certain types of electrical energy sources.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Figure 1:
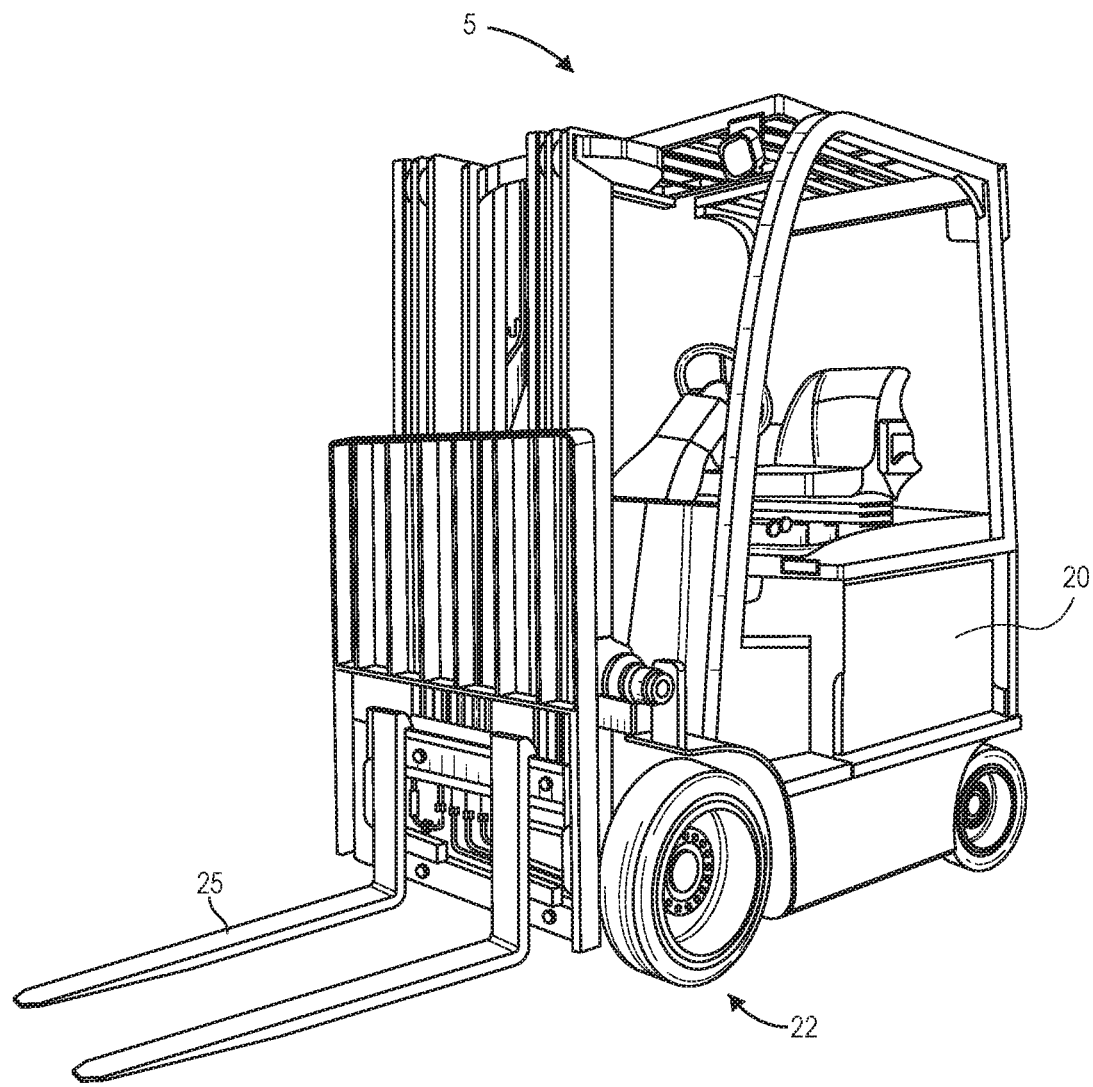
FIG. 1 illustrates an exemplary electric vehicle with a multi-source capability for its electrical energy source.

Apparatuses, kits, methods and storage medium associated with electric vehicles capable of operation with multiple types of electrical energy sources are disclosed herein. In embodiments, one or more non-transitory computer-readable media having instructions stored thereon, wherein the instructions, in response to execution by a vehicle controller of an electric vehicle, may cause the vehicle controller to detect an indication of a type of an electrical energy source connected to the electric vehicle, the electrical energy source to power a traction motor of the electric vehicle. Further, the instructions may cause the vehicle controller to determine, based on the indication, the type of the electrical energy source, and implement an energy source monitoring profile corresponding to the type of the electrical energy source.

In the following detailed description, reference is made to the accompanying drawings which form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Aspects of the disclosure are disclosed in the accompanying description. Alternate embodiments of the present disclosure and their equivalents may be devised without parting from the spirit or scope of the present disclosure. It should be noted that like elements disclosed below are indicated by like reference numbers in the drawings.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "circuitry" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

An electric counterbalanced forklift truck is discussed in the following description. However, any suitable electric vehicle may implement the features discussed throughout the following description and it is to be understood that the term electric vehicle is not intended to be limited to an electric counterbalanced forklift truck.

Figure 2:
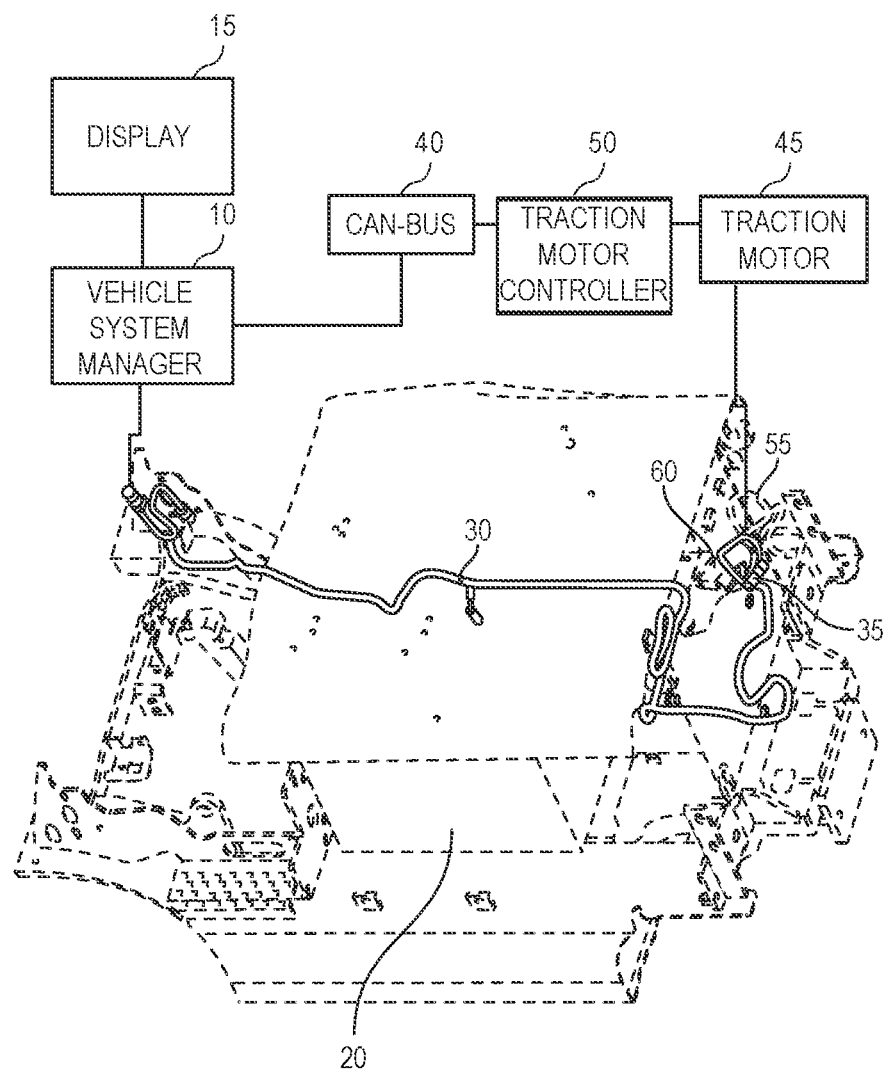
FIG. 2 illustrates a schematic diagram of a first arrangement of components for the vehicle of FIG. 1.

An electric counterbalanced forklift truck 5 (referred to as "forklift 5") includes a vehicle controller, such as vehicle system manager ("VSM") 10 (FIG. 2). The VSM 10 controls operation of functions of the forklift 5 based on operator input received from various input devices such as a directional control, an accelerator pedal, a brake pedal, lift and lower levers, a steering wheel, or some combination thereof.

The VSM 10 may also provide information to an operator via a display 15 (FIG. 2). Such information may include energy source depletion status (such as a battery state-of-charge that indicates the amount, or percentage, of electrical energy remaining in the electrical energy source 20), settings for the forklift 5, or other suitable information.

The VSM 10 may use energy source depletion status, such as a battery state-of-charge, as an input for controlling operation of certain functions of the forklift 5. Several example functions for the forklift 5 are described, however additional or different functions may be influenced by the energy source depletion status for the forklift 5. Different or additional functions may be influenced by the energy source depletion status for other electric vehicles. Optionally, for forklift 5, when energy source 20 is depleted to a predetermined amount (such as 10% of the capacity of the energy source 20 remaining), the VSM 10 may limit the speed of the forklift 5 to 5 kilometers per hour as a physical indication to the operator that the energy source 20 needs to be recharged. For example, the VSM 10 may cause a traction motor controller 50 (FIG. 2) to limit a speed of a traction motor 45 (FIG. 2) that causes the forklift 5 to be propelled (such as by drive wheels 22) to a maximum speed that causes the forklift 5 to be propelled at 5 kilometers per hour. Optionally, a lift function that allows forks 25 to be raised from a lowered position (as illustrated in FIG. 1) may be locked-out and thus inoperative when energy source 20 reaches a predetermined depletion amount (such as 10% of the capacity of the energy source 20 remaining). For example, the VSM 10 may limit the forks 25 to being maintained at a current height or lowered when the energy source 20 reaches the predetermined depletion amount. Optionally, a parking brake may be configured to be spring applied and have an electronic actuator that overcomes the spring force. When the energy source 20 reaches a predetermined depletion amount, such as 5% of its capacity remaining, the VSM 10 may optionally slow the forklift 5 (by reducing the speed of the traction motor 45) then cause the parking brake to be applied by removing power from the electronic actuator that overcomes the spring force.

The VSM 10 may also use energy source depletion status, such as a battery state-of-charge, as an input for information to be displayed to an operator. For example, the VSM 10 may display one or more of the percentage of electrical energy remaining, amount of electrical energy remaining, an estimated or calculated run time remaining, or other suitable information based on energy source depletion status.

To enable the VSM 10 to properly control operations of the forklift 5, and to provide accurate information regarding the energy source 20 to an operator, the forklift 5 is equipped with a multi-source capability. The multi-source capability may include the ability to identify, by one or more components of the forklift 5, a type of the energy source 20 and implement an energy source monitoring profile corresponding to the type of the energy source 20. For example, such multi-source capability allows an owner or operator of forklift 5 to use either a lead-acid battery or a lithium-ion battery as the energy source 20 for the forklift 5. The components of the forklift 5 may determine whether a lead-acid battery or a lithium-ion battery is connected to the forklift 5 and may implement an energy source monitoring profile corresponding to the lead-acid battery or the lithium-ion battery based on the determination. The VSM 10 can determine the proper energy source depletion status for the energy source 20 based on the energy source monitoring profile being implemented corresponding to the lead-acid battery or the lithium-ion battery that is connected to the forklift 5, thereby allowing the VSM 10 to properly control the operations of the forklift 5. For other electric vehicles equipped with a multi-source capability, such multi-source capability may enable use of two, or more, different types of electrical energy sources, including, but not limited to, a lead-acid battery, a nickel-cadmium battery, a nickel-metal hydride battery, a lithium-ion battery, a lithium-ion polymer battery, a zinc-air battery, a molten-salt battery, a hydrogen fuel cell, and an ultra-capacitor. Further, the other electric vehicles may implement energy source monitoring profiles corresponding to the different types of electrical energy sources.

Figure 3:
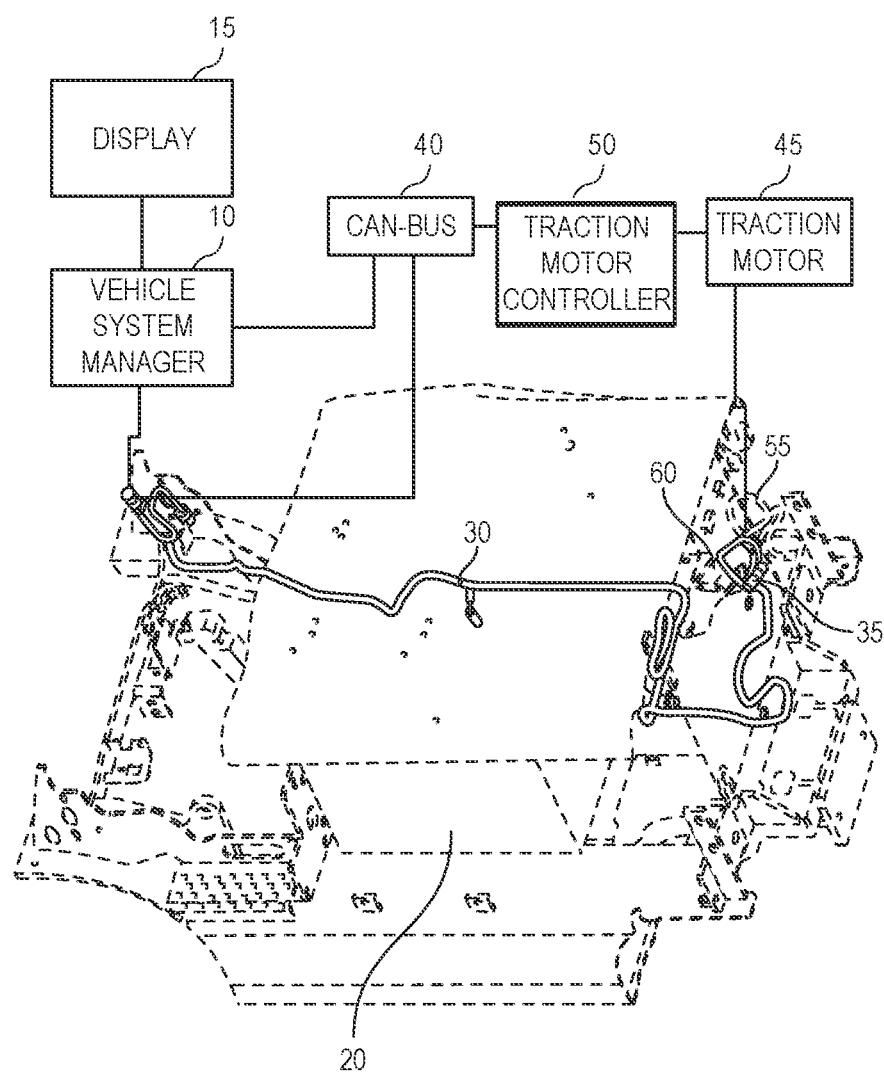
FIG. 3 illustrates a schematic diagram of a second arrangement of components for the vehicle of FIG. 1.

An electrical energy source communication system may be included in an electric vehicle to provide communication between certain types of electrical energy sources 20 and a vehicle controller, such as the VSM 10. In the illustrated example, forklift 5 includes a wire harness 30 that serves as the electrical energy source communication system. Wire harness 30 includes a communication connector 35 configured to interface with certain types of electrical energy sources 20. Configured to interface with certain types of electrical energy sources means that the communication connector 35 includes features that physically, electronically, or both physically and electronically, engage a system or component of certain types of electrical energy sources 20 to enable information to transmit between such electrical energy sources 20 and a vehicle controller via the electrical energy source communication system. In the illustrated embodiments, wire harness 30 communicates with the VSM 10 by either a direct connection (FIG. 2) or via CAN-bus 40 (FIG. 3). Other suitable communication links between a vehicle controller and an electrical energy source communication system may be used.

In other embodiments, the electrical energy source communication system may comprise a wireless communication device or network, a dedicated or non-dedicated communication path of a vehicle system communication system, for example, CAN-bus 40, or other suitable communication system.

The electric vehicle may also include a vehicle mounted electrical energy source status determining unit to provide information regarding certain types of electrical energy sources 20. In the illustrated example, forklift 5 includes a traction motor 45 and a traction motor controller 50. The traction motor controller 50 may implement energy source programming that causes the traction motor controller 50 to determine the energy source depletion of the energy source 20 based on one or both of the voltage and current supplied by the energy source 20 to the traction motor 45 via a power relay system 55. The traction motor controller 50 communicates the energy source depletion information to the VSM 10, for example, via CAN-bus 40. In other embodiments, VSM 10 may implement the energy source programming that causes VSM 10 to determine the energy source depletion of the energy source 20 and the traction motor controller 50 may communicate one or both of the voltage and current supplied by the energy source 20 to the traction motor 45 via the power relay system 55. In other embodiments, the vehicle mounted electrical energy source status determining unit may include a separate voltage or current monitoring device that communicates one or both of the voltage and current supplied by the energy source 20, via the power relay system 55, to the traction motor 45 to either the VSM 10 or to the traction motor controller 50, depending on which of the VSM 10 or the traction motor controller 50 implements the energy source programming. Alternatively, the energy source programming may be implemented via the separate voltage or current monitoring device and the energy source depletion information may be communicated to the VSM 10 from the voltage or current monitoring device.

The electric vehicle may also include an electrical energy source type indicator to provide information to the vehicle controller regarding what type of electrical energy source is powering the vehicle. In the illustrated example, the forklift 5 includes programming to be implemented by the VSM 10, where the programming causes an electrical energy source type indication interface to be displayed on a display 15 of the electric vehicle. An operator may interact with the electrical energy source type indication interface displayed on the display 15 (for example, via buttons associated with display 15, a touch screen, or other suitable input device) to indicate the type of electrical energy source 20 that is powering the vehicle. The display 15 may communicate a type signal to the VSM 10 based on the operator interaction with the electrical energy source type indication interface. The type signal may indicate the type of the electrical energy source 20 to the VSM 10. For example, after the operator interacts with the electrical energy source type indication interface displayed on the display 15 to indicate that the type of electrical energy source 20 is a lead-acid battery, the type signal may be provided to the VSM 10 to indicate to the VSM 10 that a lead-acid battery is powering the forklift 5. In other instances, after the operator interacts with the electrical energy source type indication interface displayed on the display 15 to indicate that the type of electrical energy source 20 is a lithium-ion battery, the type signal may be provided to the VSM 10 to indicate to the VSM 10 that a lithium-ion battery is powering the forklift 5.

In other embodiments, the electrical energy source type indicator may comprise programming implemented by the VSM 10, or other suitable vehicle controller, where the programming causes the VSM 10 to detect whether a communication connector, such as communication connector 35, interfaces with an electrical energy source 20. For example, if communication connector 35 interfaces with a battery management system ("BMS") of a lithium-ion battery, a first portion of the circuitry of the VSM 10, by implementing the programming, may detect the interface between the communication connector 35 and the BMS, and, in response, may transmit a type signal to a second portion of the circuitry of the VSM 10, where the type signal indicates that a lithium-ion battery is powering the forklift 5. However, if communication connector 35 does not interface with a BMS of a lithium-ion battery, the first portion of the circuitry of the VSM 10, by implementing the programming, may detect the lack of an interface between the communication connector 35 and the BMS, and in response may transmit a type signal to the second portion of the circuitry of the VSM 10, where the type signal indicates that a lead-acid battery is powering the forklift 5. In some embodiments, the second portion of the circuitry of the VSM 10 may implement other programming that causes the second portion of the circuitry of the VSM 10 to implement the energy source monitoring profile corresponding to the type of electrical energy source 20 indicated by the type signal.

In other embodiments, the electrical energy source type indicator may comprise programming implemented by the VSM 10, or other suitable vehicle controller, where the programming causes the VSM 10 to detect the presence, or lack, of a handshake, a heartbeat, a presence signal, or other suitable signal from an electrical energy source 20. For example, the BMS of a lithium-ion battery may transmit a handshake, a heartbeat, or a presence signal to the VSM 10 via the wire harness 30, or other suitable electrical energy source communication system. In response, a first portion of the circuitry of the VSM 10, by implementing the programming, may transmit a type signal to a second portion of the circuitry of the VSM 10, where the type signal indicates that a lithium-ion battery is powering the forklift 5. However, if the VSM 10 does not detect a heartbeat or presence signal from a lithium-ion battery, the first portion of the circuitry of the VSM 10, by implementing the programming, may, in response to detecting a lack of a handshake, a heartbeat, and a presence signal, transmit a type signal to a second portion of the circuitry of the VSM, where the type signal indicates that a lead-acid battery is powering the forklift 5. In some embodiments, the second portion of the circuitry of the VSM 10 may implement other programming that causes the second portion of the circuitry of the VSM 10 to implement the energy source monitoring profile corresponding to the type of electrical energy source 20 indicated by the type signal.

Optionally, certain types of electrical energy sources 20 include an energy source mounted EESSDU. For example, typical lithium-ion batteries include a BMS. The BMS may implement programming that causes the BMS to provide information regarding the lithium-ion battery. Such information may include one or more of the energy source depletion status of the lithium-ion battery, remaining run time for the lithium-ion battery, or other suitable information.

In operation of the example forklift 5, a lead-acid battery is connected to the forklift 5 as the electrical energy source 20. The power relay system 55 is connected to the lead-acid battery via power connector 60 to enable electrical energy to be provided from the electrical energy source 20 to one or more systems of the forklift 5, for example, traction motor 45 and the traction motor controller 50. An operator powers on the forklift 5 and interacts with an electrical energy source type indication interface displayed on the display 15, which may serve as an electrical energy source type indicator, to cause a type signal to be sent to the VSM 10 where the type signal indicates a lead-acid battery. Optionally, the forklift 5 may be powered off and powered on again after the type signal is sent to the VSM 10 before the VSM 10 implements the energy source monitoring profile corresponding to a lead-acid battery and allows the operator to control other systems of the forklift 5, such as the traction motor 45, a system that raises and lowers the forks 25, or some combination thereof.

Based on the type signal, the VSM 10, by implementing programming, determines to use information from a vehicle mounted EESSDU, such as the traction motor controller 50, which is implementing other programming. Based on energy source depletion status information from the traction motor controller 50, the VSM may provide battery state-of-charge information via the display 15, may limit the speed of the forklift 5, may lock-out one or more vehicle systems, may slow the forklift 5 and apply the parking brake (which may include removing power from the electronic actuator of the parking brake), or take other suitable action.

When the forklift 5 is powered off, the lead-acid battery may be disconnected from the forklift 5, and a lithium-ion battery and BMS 23 may be connected to the forklift 5 as the electrical energy source 20 for the forklift 5. Power connector 60 is optionally configured to engage more than one type of electrical energy source 20. Thus, the power relay system 55 is connected to the lithium-ion battery and BMS 23 via power connector 60 to enable electrical energy to be provided from the electrical energy source 20 to one or more systems of the forklift 5, such as the traction motor 45 and the traction motor controller 50. An electrical energy source communication system, for example, wire harness 30, may facilitate communications with the electrical energy source 20. For example, such communication may occur via the communication connector 35 being connected to the energy source 20, may occur via the power connector 60 being connected to the energy source 20, or via any other suitable manner. An operator may power on the forklift 5 and interact with an electrical energy source type indication interface displayed on the display 15, which may serve as an electrical energy source type indicator, to cause a type signal to be sent to the VSM 10 where the type signal indicates a lithium-ion battery. Optionally, the forklift 5 may be powered off and powered on again after the type signal is sent to the VSM 10 before the VSM 10 implements the energy source monitoring profile corresponding to a lithium-ion battery and allows the operator to control other systems of the forklift 5, such as the traction motor 45, a system that raises and lowers the forks 25, or some combination thereof.

Based on the type signal, the VSM 10, by implementing programming, may determine to use information from an energy source mounted EESSDU, such as the BMS 23 that is implementing programming. Based on energy source depletion status information from the BMS 23, the VSM 10 may provide battery state-of-charge information via the display 15, may limit the speed of the forklift 5, may lock-out one or more vehicle systems, or may slow the forklift 5 and apply the parking brake, or take other suitable action.

Figure 5:
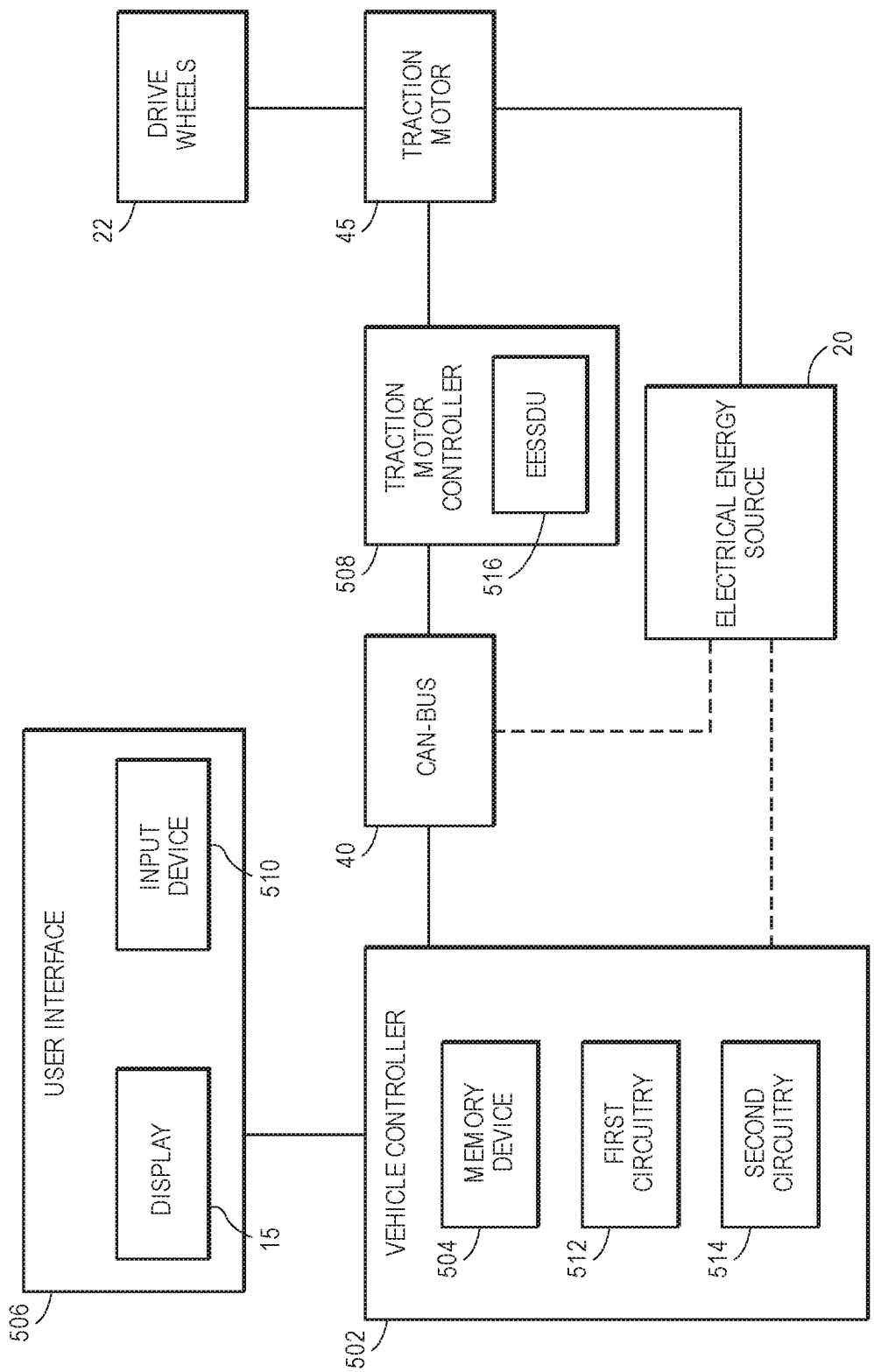
FIG. 5 illustrates a block diagram of another arrangement of components for the vehicle of FIG. 1.

FIG. 5 illustrates a block diagram of another arrangement of components for the vehicle of FIG. 1. In other embodiments, the components and/or the features of the components described herein may be implemented in other electric vehicles.

The components include a vehicle controller 502. The vehicle controller 502 may comprise a VSM, such as the VSM 10 (FIG. 2 and FIG. 3), and may include one or more features of the VSM 10. For example, the vehicle controller 502 controls operation of functions of the vehicle, such as movement of the forks 25 (FIG. 1), movement of vehicle, operation of one or more of the other components, or some combination thereof. The vehicle controller 502 can control the operation of the functions based on input received from various input devices such as a directional control, an accelerator pedal, a brake pedal, lift and lower levers, a steering wheel, or some combination thereof. Further, the vehicle controller 502 comprises circuitry that facilitates controlling the operation of the functions. The vehicle controller 502 may include, or may be coupled to, a memory device 504. The memory device 504 has programming (which includes a plurality of instructions) stored thereon that can be implemented by the vehicle controller 502, or portions thereof. When the vehicle controller 502 executes the instructions included in the programming, the vehicle controller 502 may perform one or more of the operations to be performed by the vehicle controller 502 and/or a VSM described throughout this disclosure.

The components further include a user interface 506 coupled to the vehicle controller 502. The user interface 506 may facilitate control of the vehicle by an operator of the vehicle. The user interface 506 includes a display 15 and an input device 510. The display 15 may display graphical user interfaces to an operator of the vehicle, where the graphical user interfaces may provide information associated with the vehicle, operation of the vehicle, or some combination thereof. The input device 510 is a device that can receive input from the operator, such as a mouse, a keyboard, one or more buttons, a joystick, a lever, a steering wheel, or some combination thereof. In some embodiments, the input device 510 may comprise a tactile user interface and may be combined with the display 15, such as a touch screen display.

The components further include a CAN-bus 40. The CAN-bus 40 can establish a connection with the vehicle controller 502 and facilitate communication between the vehicle controller 502 and other components of the vehicle, as described further.

The components further include a traction motor 45 and a traction motor controller 508. The traction motor controller 508 may include one or more of the features of the traction motor controller 50 (FIG. 2 and FIG. 3). The traction motor controller 508 is coupled to the traction motor 45 and controls a speed of the traction motor 45, where the traction motor 45 can propel the vehicle, such as via drive wheels 22. The traction motor controller 508 is coupled to the vehicle controller 502 via the CAN-bus 40 and can receive commands from the vehicle controller 502 that facilitate control of the speed of the traction motor 45 via the traction motor controller 508. For example, the vehicle controller 502 detects an operator input to a vehicle speed input (such as an accelerator pedal or a brake pedal) and provides commands to the traction motor controller 508 indicating a speed at which the vehicle is to be propelled, a speed for the traction motor 45, a speed for the drive wheels 22, or some combination thereof.

The components further include an electrical energy source 20. The electrical energy source 20 may comprise a plurality of different types of electrical energy sources including a lead-acid battery, a nickel-cadmium battery, a nickel-metal hydride battery, a lithium-ion battery, a lithium-ion polymer battery, a zinc-air battery, a molten-salt battery, a hydrogen fuel cell, and an ultra-capacitor. The electrical energy source 20 is further interchangeable with different types of electrical energy sources. For example, a lead-acid battery can be disconnected from the vehicle and replaced with a lithium-ion battery.

The electrical energy source 20 may be interchangeably connected to the traction motor 45. For example, the electrical energy source 20 may be connected to the traction motor 45 via the power connector 60 (FIG. 2 and FIG. 3) and a power relay system 55 (FIG. 2 and FIG. 3), where the electrical energy source 20 can be disconnected from the traction motor 45 at the power connector 60. Further, the electrical energy source 20 is interchangeably connected to the vehicle controller 502 in some embodiments. In other embodiments, the electrical energy source 20 is interchangeably connected to the CAN-bus 40 rather than the vehicle controller 502. For example, the electrical energy source may be connected to the vehicle controller 502 or the CAN-bus 40 via the wire harness 30 (FIG. 2 and FIG. 3), where the electrical energy source 20 can be disconnected from the vehicle controller 502 or the CAN-bus 40 at the communication connector 35 (FIG. 2 and FIG. 3).

The components may further include an electrical energy source type indicator. The electrical energy source type indicator may determine a type of the electrical energy source 20 connected to the vehicle and provide an indication of the type of the electrical energy source 20 to the vehicle controller 502. In the illustrated embodiment, the electrical energy source type indicator comprises first circuitry 512 of the vehicle controller 502 (which may be referred to as "a first portion of the circuitry of the vehicle controller 502"). In particular, the first circuitry 512 may implement programming that causes the first circuitry 512 to determine the type of the electrical energy source 20 and provide the indication of the type of the electrical energy source 20 to second circuitry 514 of the vehicle controller 502 (which may be referred to as "a second portion of the circuitry of the vehicle controller 502"), where the second circuitry 514 implements programming that causes the second circuitry 514 to control operation of one or more functions of the electric vehicle. In response to receiving the indication, the second circuitry 514 implements an energy source monitoring profile that corresponds to the type of the electrical energy source 20. While the first circuitry 512 and the second circuitry 514 are illustrated as separate circuitry, it is to be understood that the first circuitry 512 and the second circuitry 514 in other embodiments may be the same circuitry, may include some of the same circuitry, may each include an entirety of the circuitry of the vehicle controller 502, or some combination thereof.

In embodiments where the electrical energy source type indicator is implemented by the first circuitry 512, determining the type of the electrical energy source 20 may include monitoring for signals from the electrical energy source 20, monitoring for interfacing with the electrical energy source 20, or some combination thereof. For example, the first circuitry 512 may monitor for a handshake, a heartbeat, or a presence signal received from the electrical energy source 20. Based on whether the handshake, the heartbeat, or the presence signal is received, the first circuitry 512 may determine the type of the electrical energy source 20. In some embodiments, the first circuitry 512 may determine that the type of the electrical energy source 20 is a lithium-ion battery in response to detecting the handshake, the heartbeat, or the presence signal, and may determine that the type of the electrical energy source 20 is a lead-acid battery in response to failing to detect the handshake, the heartbeat, or the presence signal within a predetermined time period. The first circuitry 512 may transmit an indication of the type of the electrical energy source 20 to the second circuitry 514 in response to the determination of the type of the electrical energy source 20. The second circuitry 514 can determine the type of the electrical energy source 20 based on the indication received from the first circuitry 514.

Figure 4:
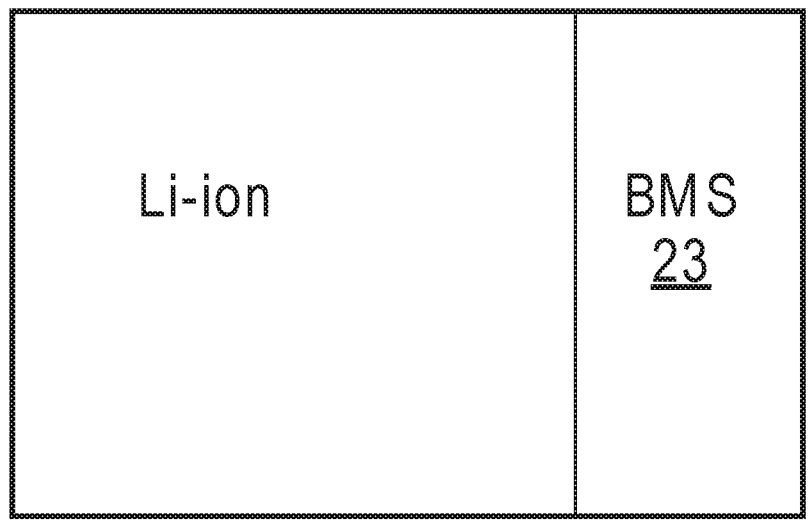
FIG. 4 illustrates a schematic diagram of a lithium-ion battery with its associated battery management system.

In other embodiments, the first circuitry 512 may detect whether an interface is established between the communication connector 35 and the electrical energy source 20. In particular, the first circuitry 512 can determine whether the communication connector 35 establishes an interface with a BMS (such as the BMS illustrated in the lithium-ion battery with BMS 23 of FIG. 4). The BMS may provide a type signal to the vehicle controller 502 via the wire harness 30 and the communication connector 35, where the type signal indicates the type of the electrical energy source 20. The first circuitry 512 may detect receipt of the type signal and, in response to receipt of the type signal, determine that the communication connector 35 has established an interface with the BMS. The first circuitry 512 may determine that the type of electrical energy source 20 is a certain type, such as a lithium-ion battery, based on the determination that the interface has been established. If the first circuitry 512 fails to detect receipt of the type signal from the BMS within a predetermined time period, the first circuitry 512 may determine that the interface has not been established. The first circuitry 512 may determine that the type of the electrical energy source 20 is a certain type, such as a lead-acid battery, based on the determination that the interface has not been established. The first circuitry 512 can transmit the indication of the determined type of the electrical energy source 20 to the second circuitry 514 in response to the determination of the type of the electrical energy source 20. The second circuitry 514 can determine the type of the electrical energy source 20 based on the indication received from the first circuitry 512.

In other embodiments, the electrical energy source type indicator is implemented by the user interface 506. For example, the display 15 may display an electrical energy source type indication interface. The vehicle controller 502 may cause the display 15 to display the electrical energy source type indication interface in response to the vehicle controller 502 detecting a startup of the vehicle, in response the vehicle controller 502 detecting that the electrical energy source 20 was disconnected from the electric vehicle (which may include detecting an interruption in electrical energy received from the electrical energy source 20), or some combination thereof. The electrical energy source type indication interface includes a prompt for the operator of the vehicle to indicate the type of the electrical energy source 20. The operator may utilize the input device 510 to indicate the type of the electrical energy source 20. The user interface 506 provides an indication of the type of the electrical energy source 20 to the vehicle controller 502 in response to the operator indicating the type of the electrical energy source 20 (which may include the operator selecting the type of the electrical energy source 20 and accepting the selection of the type). The vehicle controller 512 determines the type of the electrical energy source 20 based on the indication received from the user interface 506.

Once the vehicle controller 512, or portion thereof, determines the type of the electrical energy source 20, the vehicle controller 512 may implement an energy source monitoring profile corresponding to the type of the electrical energy source 20. Implementation of the energy source monitoring profile includes implementing an approach for determining a battery state-of-charge (such as an energy source depletion status) of the electrical energy source 20. For example, implementing the energy source monitoring profile may include utilizing a discharge voltage profile corresponding to the type of the electrical energy source 20 to determine the battery state-of-charge of the electrical energy source 20.

In some embodiments, implementation of the energy source monitoring profile may include monitoring, by the vehicle controller 512, for an indication of the battery state-of-charge received from an EESSDU 516. The EESSDU 516 may be implemented by the traction motor controller 508. For example, the electrical source status determining unit 516 may comprise circuitry of the traction motor controller 508 that implements programming that causes the circuitry to determine the battery state-of-charge of the electrical energy source 20. The electrical source status determining unit 516 may utilize a discharge voltage profile corresponding to the type of the electrical energy source 20 to determine the battery state-of-charge of the electrical energy source 20. For example, the electrical source status determining unit 516 may utilize a discharge voltage profile corresponding to a lead-acid battery to determine the battery state-of-charge when the electrical energy source 20 is lead-acid battery type. The EESSDU 516 transmits the indication of the battery state-of-charge to the vehicle controller 502 in response to determining the battery state-of-charge. The vehicle controller 502 may determine the battery state-of-charge based on the indication and may utilize the battery state-of-charge for operation of one or more of the functions of the electric vehicle, such as displaying the state-of-charge to the operator, determining when to disable or limit operation of features of the electric vehicle, or some combination thereof.

In other embodiments, implementing the energy source monitoring profile may include monitoring, by the vehicle controller 502, for an indication of the battery state-of-charge from the BMS of the electrical energy source 20. In particular, the BMS may transmit information associated with the electrical energy source 20 to the vehicle controller 502, where the information includes the indication of the battery state-of-charge. The vehicle controller 502 may determine the battery state-of-charge based on the indication and may utilize the battery state-of-charge for operation of one or more of the functions of the electric vehicle, such as displaying the state-of-charge to the operator, determining when to disable or limit operation of features of the electric vehicle, or some combination thereof.

In some embodiments, the vehicle controller 502 may require that the vehicle be restarted prior to implementation of the energy source monitoring profile. For example, the vehicle controller 502 may require the vehicle to be shut down in response to determining the type of the electrical energy source 20. In response to startup after being shut down, the vehicle controller 502 can implement the energy source monitoring profile corresponding to the type of the electrical energy source 20. In other embodiments, the vehicle controller 502 will implement the energy source monitoring profile without requiring the vehicle to be restarted.

Figure 6:
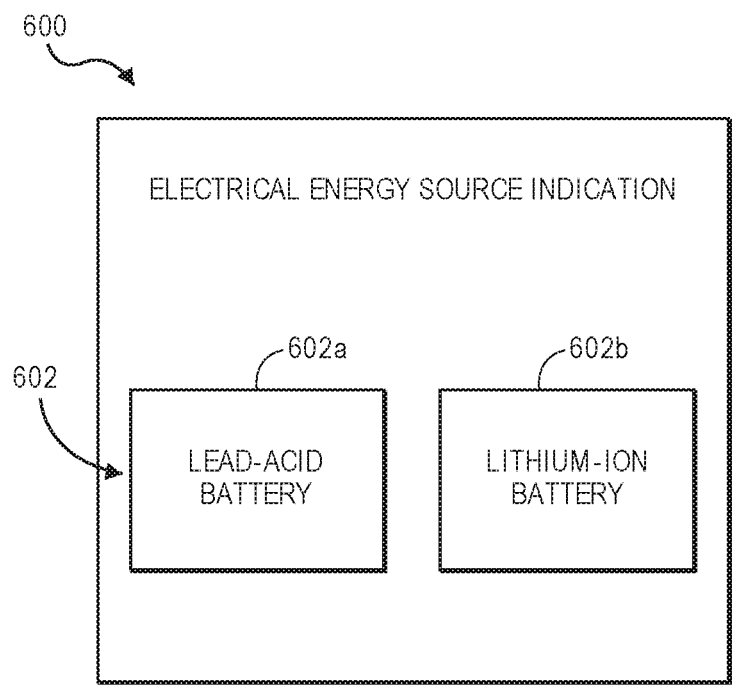
FIG. 6 illustrates an example electrical energy source type indication interface that may be displayed on the display of the electric vehicle.

FIG. 6 illustrates an example electrical energy source type indication interface 600 that may be displayed on the display 15 (FIG. 2, FIG. 3, and FIG. 5) of the electric vehicle. For example, a vehicle controller (such as the VSM 10 (FIG. 2 and FIG. 3) or the vehicle controller 502 (FIG. 5)) can cause the electrical energy source type indication interface 600 to be displayed on the display 15 in response to the vehicle controller 502 detecting a startup of the vehicle, in response the vehicle controller 502 detecting that the electrical energy source 20 (FIG. 1, FIG. 2, FIG. 3, and FIG. 5) was disconnected from the electric vehicle (which may include detecting an interruption in electrical energy received from the electrical energy source 20), or some combination thereof. The operator of the electric vehicle may interact with the electrical energy source type indication interface 600 via an input device (such as the input device 510 (FIG. 5)) to indicate a type of the electrical energy source 20 connected to the electric vehicle.

The electrical energy source type indication interface 600 includes a prompt 602 for the operator to indicate the type of the electrical energy source 20. In the illustrated embodiment, the prompt 602 includes a plurality of buttons that the operator may interact with, via the input device, to indicate the type of the electrical energy source 20. Each of the buttons may correspond to one of a plurality of types of electrical energy sources which are capable of being utilized by the electric vehicle. For example, a first button 602a corresponds to a lead-acid battery type of electrical energy source and a second button 602b corresponds to a lithium-ion battery type of electrical energy source. The operator may select, via the input device, one of the buttons to indicate the type of the electrical energy source. In other embodiments, the prompt 602 may include a field in which an operator can enter the type of the electrical energy source 20, an indication of the type of the electrical energy source 20 (such as a model number or a serial number), or some combination thereof.

Figure 7:
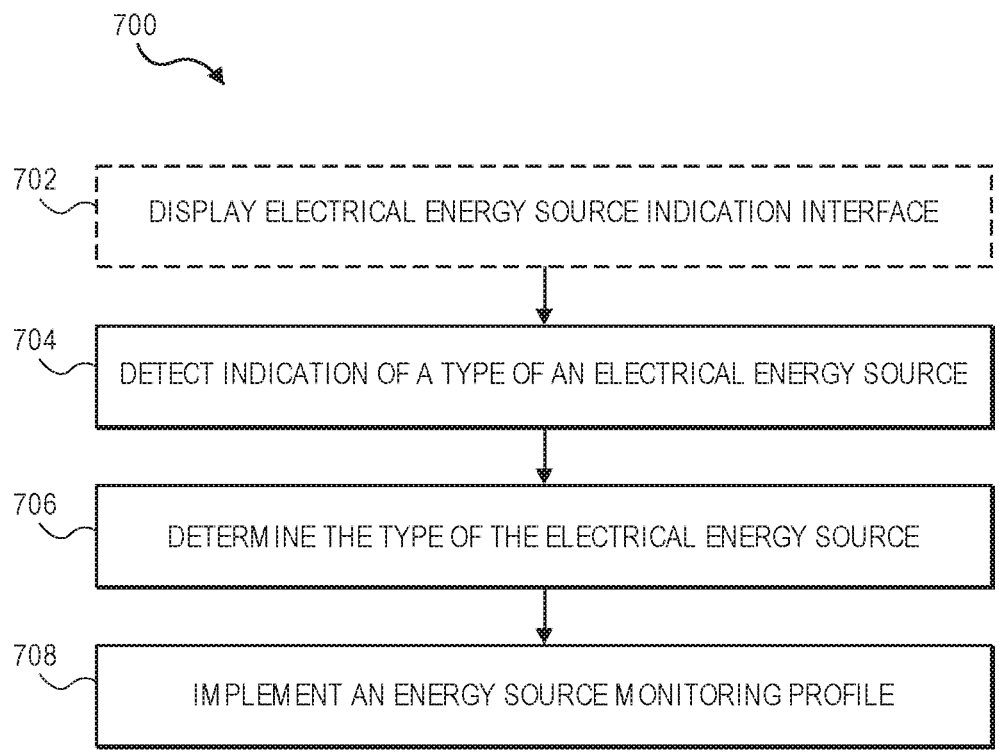
FIG. 7 illustrates a procedure for determination of type of an electrical energy source of a multi-source capable electric vehicle.

FIG. 7 illustrates a procedure 700 for determining a type of an electrical energy source of a multi-source capable electric vehicle. The procedure 700 may be implemented by the components of electric vehicles described herein.

In stage 702, an electrical energy source indication interface may be displayed on a display of the electric vehicle. For example, a vehicle controller (such as the VSM 10 (FIG. 2 and FIG. 3) or the vehicle controller 502 (FIG. 5)) may cause the electrical energy source indication interface to be displayed on a display (such as the display 15 (FIG. 2, FIG. 3, and FIG. 5)) of the electric vehicle in response to the vehicle controller detecting a startup of the vehicle, in response the vehicle controller detecting that the electrical energy source (such as the electrical energy source (FIG. 1, FIG. 2, FIG. 3, and FIG. 5)) was disconnected from the electric vehicle, or some combination thereof. The electrical energy source indication interface may comprise the electrical energy source indication interface 600 (FIG. 6). In other embodiments, stage 702 may be omitted.

In stage 704, an indication of the type of the electrical energy source may be detected. For example, the vehicle controller, or some portion thereof, may detect the indication of the type of the electrical energy source. The indication of the type of the electrical energy source may include any of the indications of the type of the electrical energy source described herein, including the indication provided by the display or user interface, the indication provided by the first circuitry of the vehicle controller, the indication provided by the BMS, some combination thereof, or other suitable indication.

In stage 706, the type of the electrical energy source may be determined. For example, the vehicle controller, or some portion thereof, may determine the type of the electrical energy source based on the indication received in stage 704.

In stage 708, an energy source monitoring profile may be implemented. For example, the vehicle controller may implement an energy source monitoring profile corresponding to the type of the electrical energy source. The implementation of the energy source monitoring profile may comprise the implementation of any of the energy source monitoring profiles described herein, or other suitable energy source monitoring profile.

Figure 8:
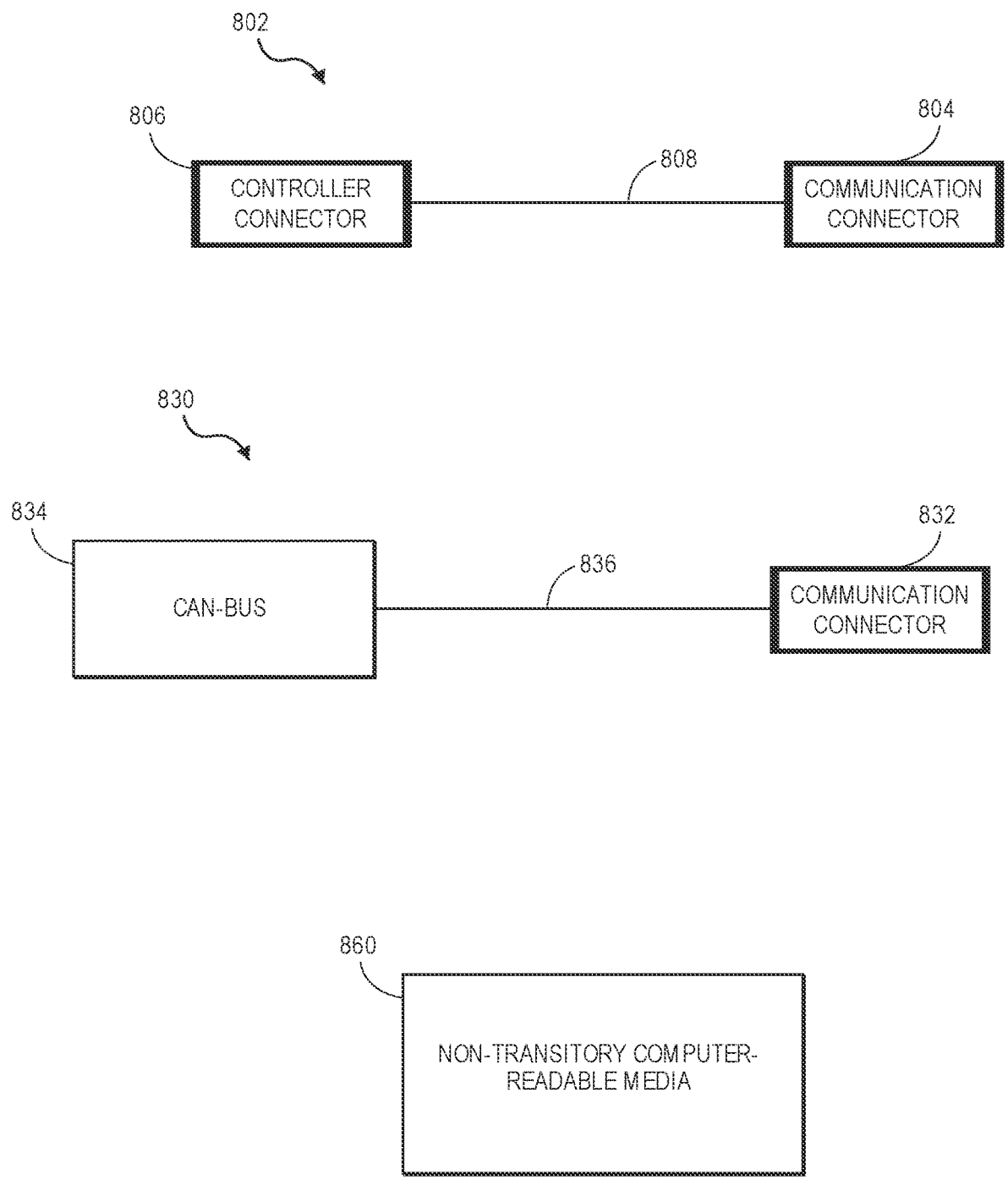
FIG. 8 illustrates components of an example of kits for an electric vehicle configured to operate with a lead-acid electrical energy source.

FIG. 8 illustrates components of an example of kits for an electric vehicle configured to operate with a lead-acid electrical energy source. In particular, the kits may be utilized for converting electric vehicles configured to operate properly only with a lead-acid type of electrical energy source to be able to operate properly with multiple different types of electrical energy sources.

The components include a first wire harness 802. The first wire harness 802 may include one or more of the features of the wire harness 30 (FIG. 2 and FIG. 3). The first wire harness 802 includes a communication connector 804. The communication connector 804 may include one or more of the features of the communication connector 35 (FIG. 2 and FIG. 3). The communication connector 804 may be configured to connect to a BMS of an electrical energy source. The first wire harness 802 further includes a controller connector 806. The controller connector 806 may be configured to connect to a vehicle controller (such as the VSM 10 (FIG. 2 and FIG. 3) or the vehicle controller 502 (FIG. 5)) or a CAN-bus (such as the CAN-bus 40 (FIG. 2, FIG. 3, and FIG. 5)). The first wire harness 802 further includes one or more wires 808 that extend between the communication connector 804 and the controller connector 806, and that allow for signals to be transmitted between the communication connector 804 and the controller connector 806.

The components further include a second wire harness 830. The second wire harness 830 includes a communication connector 832. The communication connector 832 may include one or more of the features of the communication connector 804. The communication connector 832 may be configured to connect to a BMS of an electrical energy source. The second wire harness 830 further includes a CAN-bus 834. The CAN-bus 834 includes one or more of the features of the CAN-bus 40 (FIG. 2, FIG. 3, and FIG. 5). The CAN-bus 834 can establish a connection with the vehicle controller and facilitate communication between the vehicle controller and the second wire harness 830. The second wire harness 830 further includes one or more wires 836 that extend between the communication connector 832 and the CAN-bus 834, and that allow for signals to be transmitted between the communication connector 832 and the CAN-bus 834.

The components further include a non-transitory computer-readable media (CRM) 860. The CRM 860 has programming (which includes a plurality of instructions) stored thereon that may be downloaded (or otherwise transmitted) for storage on a memory device (such as the memory device 504 (FIG. 5)) of the vehicle. The programming, when executed by the vehicle controller, may cause the vehicle controller to perform one or more operations described herein, such as the operations related to determining the type of the electrical energy source and implementing energy source monitoring profiles. For example, the CRM 860 may be utilized for updating the vehicle controller to perform operations that the vehicle controller was not configured to perform prior to the updating of the vehicle controller.

The components illustrated may be included in multiple different kits. In particular, a first kit may include only the first wire harness 802, a second kit may include only the second wire harness 830, and a third kit may include only the CRM 860. Further, a fourth kit may include the first wire harness 802 and the CRM 860, and a fifth kit may include the second wire harness 830 and the CRM 860. A sixth kit may include the first wire harness 802, the second wire harness 830, and the CRM 860.

The following provides examples of some of the subject matter disclosed herein.

Example 1 may include an electric vehicle comprising a vehicle controller operatively connected to a vehicle communication system, an electrical energy source, a power relay system connected to the electrical energy source via a power connector and to at least a traction motor for propelling the vehicle, a vehicle mounted electrical energy source status determining unit communicating with the vehicle controller, an electrical energy source type indicator communicating with the vehicle controller, wherein the electrical energy source type indicator transmits a type signal to the vehicle controller and the type signal indicates to the vehicle controller a specific type for the electrical energy source, wherein the vehicle controller includes programming to determine whether to use information from the vehicle mounted electrical energy source status determining unit based on the type signal.

Example 2 may include the vehicle according to example 1, wherein the electrical energy source comprises a lead-acid battery, the type signal indicates a lead-acid battery, and the vehicle controller programming is configured to determine to use information from the vehicle mounted electrical energy source status determining unit based on the type signal indicating a lead-acid battery.

Example 3 may include the vehicle according to example 1, further comprising an electrical energy source communication system communicating with the vehicle controller, the electrical energy source communication system comprising a communication connector configured to interface with certain types of electrical energy sources.

Example 4 may include the vehicle according to example 3, wherein the electrical energy source communication system is operatively connected to the vehicle communication system for communicating with the vehicle controller.

Example 5 may include the vehicle according to example 3, wherein the electrical energy source comprises a lead-acid battery, the type signal indicates a lead-acid battery, and the vehicle controller programming determines to use information from the vehicle mounted electrical energy source status determining unit based on the type signal indicating a lead-acid battery.

Example 6 may include the vehicle according to example 4, wherein the electrical energy source comprises a lithium-ion battery, and the lithium-ion battery comprises an energy source mounted electrical energy source status determining unit interfacing with the communication connector, the type signal indicates a lithium-ion battery, and the vehicle controller programming determines to use information from the energy source mounted electrical energy source status determining unit based on the type signal indicating a lithium-ion battery.

Example 7 may include the vehicle according to example 5, wherein the electrical energy source type indicator comprises a human operable interface that transmits the type signal in response to human operation of the human operable interface.

Example 8 may include the vehicle according to example 5, wherein the electrical energy source type indicator comprises additional programming in the vehicle controller that transmits the type signal in response to determining whether the communication connector interfaces with the electrical energy source.

Example 9 may include the vehicle according to example 8, wherein the additional programming determines whether the communication connector interfaces with the electrical energy source in response to the presence or absence of a connection signal from the electrical energy source.

Example 10 may include the vehicle according to example 3, further comprising a motor controller operatively connected to the traction motor and to the vehicle communication system, wherein the vehicle mounted electrical energy source status determining unit comprises energy source programming in the motor controller that communicates with the vehicle controller via the vehicle communication system.

Example 11 may include the vehicle according to example 3, wherein the power relay system is operatively connected to the vehicle communication system, and the vehicle mounted electrical energy source status determining unit comprises energy source programming in the vehicle controller.

Example 12 may include the vehicle according to example 3, wherein the vehicle communication system comprises a CAN-bus, and the electrical energy source communication system comprises a wire harness.

Example 13 may include a kit for providing a multi-source capability for an electric vehicle, the electric vehicle having a vehicle controller operatively connected to a vehicle communication system, an electrical energy source, a power relay system connected to the electrical energy source via a power connector and to at least a traction motor for propelling the vehicle, and a vehicle mounted electrical energy source status determining unit communicating with the vehicle controller, the kit comprising an electrical energy source type indicator configured to communicate with the vehicle controller, wherein the electrical energy source type indicator is further configured to transmit a type signal to the vehicle controller where the type signal indicates to the vehicle controller a specific type for the electrical energy source, and programming for the vehicle controller, wherein the programming for the vehicle controller enables the vehicle controller to determine whether to use information from the vehicle mounted electrical energy source status determining unit based on the type signal.

Example 14 may include the kit according to example 13, further comprising an electrical energy source communication system configured to communicate with the vehicle controller, wherein the electrical energy source communication system comprises a communication connector configured to interface with certain types of electrical energy sources.

Example 15 may include one or more non-transitory computer-readable media having instructions stored thereon, wherein the instructions, in response to execution by a vehicle controller of an electric vehicle, cause the vehicle controller to detect an indication of a type of an electrical energy source connected to the electric vehicle, the electrical energy source to power a traction motor of the electric vehicle, determine, based on the indication, the type of the electrical energy source, and implement an energy source monitoring profile corresponding to the type of the electrical energy source.

Example 16 may include the one or more non-transitory computer-readable media of example 15, wherein the indication is received from an electrical energy source status determining unit of the electric vehicle.

Example 17 may include the one or more non-transitory computer-readable media of example 15, wherein to detect the indication includes to detect an interface between a communication connector and a management system of the electrical energy source.

Example 18 may include the one or more non-transitory computer-readable media of example 17, wherein to implement the energy source monitoring profile includes to detect state-of-charge information received from the management system of the electrical energy source, determine a state-of-charge for the electrical energy source based on the state-of-charge information, and utilize the state-of-charge for operation of one or more functions of the electric vehicle.

Example 19 may include the one or more non-transitory computer-readable media of example 15, wherein to detect the indication includes to detect whether a handshake or a heartbeat is received from the electrical energy source, and wherein to determine the type of the electrical energy source includes to determine the type of the electrical energy source based on whether the handshake or the heartbeat is received.

Example 20 may include the one or more non-transitory computer-readable media of example 15, wherein the instructions further cause the vehicle controller to detect a startup of the electric vehicle, and cause an electrical energy source type indication interface to be displayed on a display of the electric vehicle in response to detection of the startup of the electric vehicle, wherein to detect the indication includes to detect a user interaction with the electrical energy source type indication interface, and wherein the user interaction indicates the type of the electrical energy source.

Example 21 may include the one or more non-transitory computer-readable media of example 20, wherein the instructions further cause the vehicle controller to detect that the electrical energy source was disconnected from the electric vehicle, and wherein to cause the electrical energy source type indication interface to be displayed includes to cause the electrical energy source type indication interface to be displayed in response to the detection of the startup and detection that the electrical energy source was disconnected from the electric vehicle.

Example 22 may include the one or more non-transitory computer-readable media of example 15, wherein to implement an energy source monitoring profile includes to utilize a discharge voltage profile corresponding to the type of the electrical energy source for determination of a state-of-charge that is utilized for operation of one or more functions of the electric vehicle.

Example 23 may include an electric vehicle, comprising a traction motor to propel the electric vehicle, a power relay system coupled to the traction motor, the power relay system coupled to a power connector that is to connect to an electrical energy source for the electric vehicle, wherein the electrical energy source is to provide power to the traction motor, and a vehicle controller coupled to the electrical energy source, the vehicle controller to control operation of one or more functions of the electric vehicle, detect an indication of a type of the electrical energy source when the electrical energy source is connected to the power connector, and implement an energy source monitoring profile corresponding to the type of the electrical energy source based on the indication of the type of the electrical energy source.

Example 24 may include the electric vehicle of example 23, further comprising an electrical energy source type indicator coupled to the vehicle controller, the electrical energy source type indicator to determine the type of the electrical energy source when the electrical energy source is connected to the power connector, generate the indication of the type of the electrical energy source, and provide the indication to the vehicle controller.

Example 25 may include the electric vehicle of example 24, wherein the electrical energy source type indicator comprises a first portion of circuitry of the vehicle controller that is configured by programming to determine the type of the electrical energy source, and wherein to provide the indication to the vehicle controller includes to provide the indication to a second portion of the circuitry of the vehicle controller that is to implement the energy source monitoring profile.

Example 26 may include the electric vehicle of example 24, further comprising an electrical energy source communication system with a communication connector that is to couple to a management system of the electrical energy source, the electrical energy source communication system coupled to the electrical energy type indicator, wherein to determine the type of the electrical energy source includes to determine whether the communication connector interfaces with the management system.

Example 27 may include the electric vehicle of example 24, wherein to determine the type of the electrical energy source includes to determine whether information is received from the electrical energy source.

Example 28 may include the electric vehicle of example 23, further comprising a user interface coupled to the vehicle controller, wherein to detect the indication of the type of the electrical energy source includes to detect a type signal generated in response to interaction with the user interface, and wherein the type signal indicates the type of the electrical energy source.

Example 29 may include the electric vehicle of example 28, wherein the user interface includes a display and an input device, wherein the display is to display a plurality of types of electrical energy sources that can be utilized by the electric vehicle, and wherein the input device allows a user to indicate the type of the electrical energy source from the plurality of types of electrical energy sources.

Example 30 may include the electric vehicle of example 23, wherein the electric vehicle is a forklift truck.

Example 31 may include a kit for determination of a type of electrical energy source of an electric vehicle configured to operate with a lead-acid electrical energy source, the kit comprising a communication connector to couple to at least one type of electrical energy source, and an electrical energy source communication system coupled to the communication connector and to couple to a vehicle controller of the electric vehicle, the vehicle controller to control operation of one or more functions of the electric vehicle, wherein the communication connector and the electrical energy source communication system are to facilitate determination of the type of the electrical energy source.

Example 32 may include the kit of example 31, wherein the communication connector is to couple to a management system of at least one type of electrical energy source, and wherein the kit further comprises one or more non-transitory computer-readable media having programming stored thereon, wherein the programming is to be downloaded from the one or more non-transitory computer-readable media to vehicle controller and, in response to the programming being executed by the vehicle controller, cause the vehicle controller to detect whether an interface is established between the communication connector and the management system, and determine the type of the electrical energy source based on whether the interface is established.

Example 33 may include the kit of example 32, wherein, in response to detecting the interface is established, the programming is further to cause the vehicle controller to utilize information from the management system to determine state-of-charge for the electrical energy source.

Example 34 may include the kit of example 31, wherein the electrical energy source communication system is to couple to the vehicle controller via a controller area network bus (CAN-bus) of the electric vehicle.

It will be apparent to those skilled in the art that various modifications and variations can be made in the disclosed embodiments of the disclosed device and associated methods without departing from the spirit or scope of the disclosure. Thus, it is intended that the present disclosure covers the modifications and variations of the embodiments disclosed above provided that the modifications and variations come within the scope of any claims and their equivalents.

What is claimed is:

1. One or more non-transitory computer-readable media having instructions stored thereon, wherein the instructions, in response to execution by a vehicle controller of an electric vehicle, cause the vehicle controller to:
    detect an indication of a type of an electrical energy source connected to the electric vehicle, the electrical energy source to power a traction motor of the electric vehicle;
    determine, based on the indication, the type of the electrical energy source; and
    implement an energy source monitoring profile corresponding to the type of the electrical energy source,
    wherein to detect the indication includes to detect whether a signal is received from the electrical energy source, and wherein to determine the type of the electrical energy source includes to determine, based on whether the signal is received, the type of the electrical energy source,
    wherein detection of the presence of a signal from the electrical energy source indicates a first type of electrical energy source, and detection of the lack of a signal from the electrical energy source indicates a second type of electrical energy source.

2. The one or more non-transitory computer-readable media of claim 1, wherein the indication is received from an electrical energy source status determining unit of the electric vehicle.

3. The one or more non-transitory computer-readable media of claim 1, wherein to detect the indication includes to detect an interface between a communication connector and a management system of the electrical energy source.

4. The one or more non-transitory computer-readable media of claim 3, wherein to implement the energy source monitoring profile includes to:
    detect state-of-charge information received from the management system of the electrical energy source;
    determine a state-of-charge for the electrical energy source based on the state-of-charge information; and
    utilize the state-of-charge for operation of one or more functions of the electric vehicle.

5. The one or more non-transitory computer-readable media of claim 1, wherein the instructions further cause the vehicle controller to:
    detect a startup of the electric vehicle; and
    cause an electrical energy source type indication interface to be displayed on a display of the electric vehicle in response to detection of the startup of the electric vehicle.

6. The one or more non-transitory computer-readable media of claim 5, wherein the instructions further cause the vehicle controller to detect that the electrical energy source was disconnected from the electric vehicle, and wherein to cause the electrical energy source type indication interface to be displayed includes to cause the electrical energy source type indication interface to be displayed in response to the detection of the startup and detection that the electrical energy source was disconnected from the electric vehicle.

7. The one or more non-transitory computer-readable media of claim 1, wherein to implement an energy source monitoring profile includes to utilize a discharge voltage profile corresponding to the type of the electrical energy source for determination of a state-of-charge that is utilized for operation of one or more functions of the electric vehicle.

8. An electric vehicle, comprising:
    a traction motor to propel the electric vehicle;
    a power relay system coupled to the traction motor, the power relay system coupled to a power connector that is to connect to an electrical energy source for the electric vehicle, wherein the electrical energy source is to provide power to the traction motor; and
    a vehicle controller coupled to the electrical energy source, the vehicle controller to:
    control operation of one or more functions of the electric vehicle;
    detect an indication of a type of the electrical energy source when the electrical energy source is connected to the power connector; and
    implement an energy source monitoring profile corresponding to the type of the electrical energy source based on the indication of the type of the electrical energy source;
    wherein to detect the indication includes to detect whether a signal is received from the electrical energy source, and wherein to determine the type of the electrical energy source includes to determine, based on whether the signal is received, the type of the electrical energy source,
    wherein detection of the presence of a signal from the electrical energy source indicates a first type of electrical energy source, and detection of the lack of a signal from the electrical energy source indicates a second type of electrical energy source.

9. The electric vehicle of claim 8, further comprising an electrical energy source type indicator coupled to the vehicle controller, the electrical energy source type indicator to:
- determine the type of the electrical energy source when the electrical energy source is connected to the power connector;
- generate the indication of the type of the electrical energy source; and
- provide the indication to the vehicle controller.

10. The electric vehicle of claim 9, wherein the electrical energy source type indicator comprises a first portion of circuitry of the vehicle controller that is configured by programming to determine the type of the electrical energy source, and wherein to provide the indication to the vehicle controller includes to provide the indication to a second portion of the circuitry of the vehicle controller that is to implement the energy source monitoring profile.

11. The electric vehicle of claim 9, further comprising an electrical energy source communication system with a communication connector that is to couple to a management system of the electrical energy source, the electrical energy source communication system coupled to the electrical energy type indicator, wherein to determine the type of the electrical energy source includes to determine whether the communication connector interfaces with the management system.

12. The electric vehicle of claim 9, wherein to determine the type of the electrical energy source includes to determine whether information is received from the electrical energy source.

13. The electric vehicle of claim 8, further comprising a user interface coupled to the vehicle controller, wherein the user interface provides information associated with the vehicle to an operator of the vehicle.

14. The electric vehicle of claim 13, wherein the user interface includes a display and an input device, wherein the display is to display battery state-of-charge information for the first type of electrical energy source or the second type of electrical energy source.

15. The electric vehicle of claim 8, wherein the electric vehicle is a forklift truck.

16. A kit for determination of a type of electrical energy source of an electric vehicle configured to operate with an electrical energy source, the kit comprising:
- a communication connector to couple to a management system disposed upon the electrical energy source;
- an electrical energy source communication system coupled to the communication connector and to couple to a vehicle controller of the electric vehicle, the vehicle controller to control operation of one or more functions of the electric vehicle, wherein the communication connector and the electrical energy source communication system are to facilitate determination of the type of the electrical energy source; and
- one or more non-transitory computer-readable media having programming stored thereon, wherein the programming causes the vehicle controller to:
  - detect whether an interface is established between the communication connector and the management system; and
  - determine, based at least in part on whether the interface is established, the type of the electrical energy source,
  - wherein detection of the establishment of the interface indicates a first type of electrical energy source, and detection of the lack of establishment of the interface indicates a second type of electrical energy source.

17. The kit of claim 16, wherein, in response to detecting the interface is established, the programming is further to cause the vehicle controller to utilize information from the management system to determine state-of-charge for the electrical energy source.

18. The kit of claim 16, wherein the electrical energy source communication system is to couple to the vehicle controller via a controller area network bus (CAN-bus) of the electric vehicle.

* * * * *